WIRE INSTALLATION

Filed Dec. 23, 1963

INVENTOR.
CHARLES H. PROPSTER, Jr.
BY Elmer Galbiati
ATTORNEY

United States Patent Office 3,279,040
Patented Oct. 18, 1966

3,279,040
WIRE INSTALLATION

Charles H. Propster, Jr., San Jose, Calif., assignor to International Business Machines Corporation, New York, N.Y., a corporation of New York Filed Dec. 23, 1963, Ser. No. 332,673
6 Claims. (Cl. 29—155.5)

This invention relates to the fabrication of electrical circuitry and, more particularly, to the installation of wires between terminals.

The components in complex electronic circuitry such as digital computers are generally mounted in modules or on printed circuit cards. These modules or printed circuit cards are in turn often mounted on one side, and sometimes on both sides, of a back-panel. The back-panel has a plurality of terminals on the second side thereof. Wires from the modules or printed circuit cards are usually attached through the back-panel to the terminals, and then the various modules or printed circuit cards are interconnected by means of wires which interconnect the various terminals.

Back-panels sometimes include a very large number of terminals and a large number of connections between the terminals. Due to the large number of terminals, it is generally difficult to accurately insure that the correct terminals are being interconnected. Furthermore, manually locating particular terminals which are to be interconnected is a very time consuming operation. Machines have been designed to automatically wire back-panels; however, these machines are expensive and they are not suited for many relatively small wiring operations such as installing wiring changes after a machine has been shipped to a customer's location.

The present invention is directed toward eliminating inaccuracy in manually interconnecting terminals and toward reducing the amount of time required to identify particular terminals which are to be interconnected.

An object of the present invention is to provide an improved means for interconnecting terminals.

A further object of the present invention is to reduce the amount of time required to selectively interconnect terminals.

Yet another object of the present invention is to eliminate the possibility of errors during the interconnection of terminals on a back-panel.

Yet another object of the present invention is to eliminate a large part of the tedious nature of the work inherent in wiring back-panels.

Yet another object of the present invention is to simplify the operation of wiring back-panels.

The present invention is directed to a method of selectively interconnecting terminals on a back-panel by a plurality of wires. The method comprises the steps of forming a mat which has a plurality of holes, the relative position of which corresponds to the relative position of a plurality of terminals on said back-panel, the ends of each wire extending through the holes in the mat which correspond to the terminals to be interconnected by the particular wire; positioning the mat over the terminals on the back-panel, each terminal extending through its corresponding hole and interconnecting each wire to the terminal juxtaposed thereto.

With the present invention, the problems of identifying the specific terminals on a back-panel which are to be interconnected, and of placing wires therebetween, are completely eliminated. While the problems of identifying specific terminals and stretching wires therebetween might on their face seem trivial, those skilled in the art realize that they are time consuming operations which present serious problems. Furthermore, in the manufacturing operation where these operations are performed manually, there are generally a substantial number of errors, the correcton of which entails considerable expense.

The present invention is especially useful in order to effect wiring changes in the field. In order to make a wiring change on a machine which is in the field and located remote from the manufacturing location, the only thing which need be shipped to the remote location is a mat having the appropriate wires thereon. No specific explanation is needed relative to which terminals need be interconnected, and there is a minimal possibility that through misunderstanding or carelessness incorrect terminals may be interconnected.

The foregoing and other objects, features and advantages of the invention will be apparent from the following more particular description of a preferred embodiment of the invention, as illustrated in the accompanying drawings.

Figure 1:
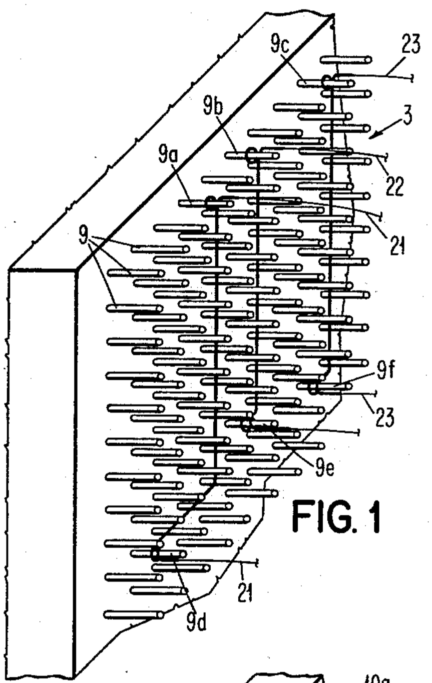
FIGURE 1 shows a portion of a template with a plurality of wires positioned thereon.
Figure 2:
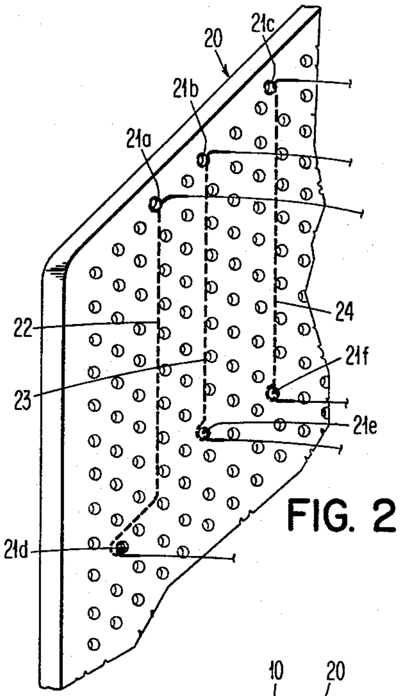
FIGURE 2 shows a mat with wires embedded therein.
Figure 3:
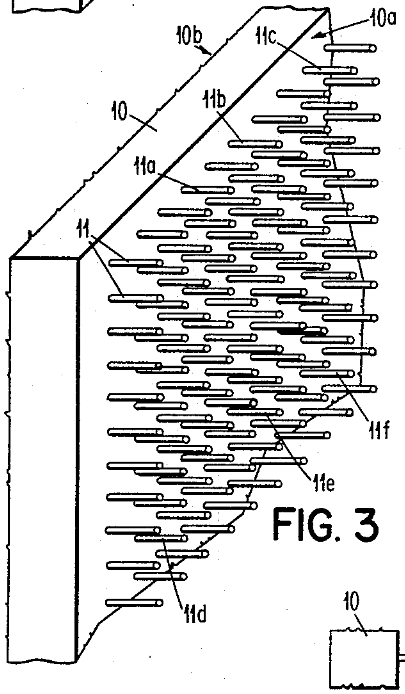
FIGURE 3 shows a portion of a back-panel.

The preferred embodiment described herein relates to the installation of a plurality of wires between the terminals 11 on the back-panel 10 shown in FIGURE 3. The mat 20 shown in FIGURE 2 is used to effect the installation and the form or template 3 shown in FIGURE 1 is used to fabricate mat 20. The template 3 has one projection or pin 9 corresponding to each of the terminals 11 on back-panel 10. These pins are positioned in the same relative position as terminals 11 and for convenience of reference the suffix used to identify each of the pins 9 is the same as the suffix used to identify the corresponding terminal 11. For example, pin 9*b* corresponds in relative location to terminal 11*b*.

In the specific embodiment described herein, the present invention is utilized to interconnect the three sets of terminals on back-panel 10 designated A, B and C below by three wires respectively designated 22, 23 and 24.

A. Terminal 11*a* will be connected to terminal 11*d*;

B. Terminal 11*b* will be connected to terminal 11*e*; and

C. Terminal 11*c* will be connected to terminal 11*f*.

As a first step, wires 22, 23 and 24 are cut to the appropriate length and positioned on template 3 as shown in FIGURE 1. The ends of each wire are loosely wrapped around the pins which correspond to the particular terminals 11 to which the particular wire will eventually interconnect. The amount of wrapping used (one turn as shown herein) merely need be sufficient to temporarily hold the wire in place. The connections to pins 9 should not be firm but instead they should be loose connections which can easily slide off the pins. After the wires are positioned on template 3, semi-liquid silicone rubber is spread or sprayed over the template 3. The silicone rubber is cured thereby forming mat 20 shown in FIGURE 2. Silicone rubber sold under the trade name Silastic RTV 588 or Silastic RTV 502 (trademark) by Dow Corning Corporation may be used. In this case the silicone rubber is cured merely by exposure to air at room temperature. The wires may be either manually positioned on template 3 or they may be automatically positioned thereon by an automatic machine similar to that presently used for wiring back-panels.

After the silicone rubber has cured it does not adhere to either template 3, pins 9 or wires 22, 23 and 24; however, it holds wires 22, 23 and 24 since they are entirely surrounded by the rubber. The cured silicone rubber with wires 22, 23 and 24 embedded therein can be removed from template 3 to form mat 20. Wiring mat 20 has a plurality of holes 21 therein corresponding the location of pins 9. These holes also correspond to the location of terminals 11 since pins 9 have the same relative location as terminals 11. For ease of reference, the holes in wiring mat 20 which correspond to the terminals **11*a* to 11*f* are respectively designated 21*a* to 21*f*. The three wires 22, 23 and 24, embedded in mat 20**, correspond to the three connections A, B and C specified above.

The uncured (i.e., catalyzed and unvalcanized) silicone rubber is quite liquid. That is, it has low viscosity and it flows readily around the wires and pins thereby covering the wires and areas around the pins. After the silicone rubber has cured it does not generally adhere to either the wires or to the pins. Since the material completely or partially encapsulates the wires it holds the wires; however, the mat including the wires can be easily removed from the template 3. If the silicone does adhere to the pins or wires, commercially available releasing agents can be applied to those surfaces where adhesion is not desired.

Back-panel 10 has a front side **10*a* and a back side 10*b*. Terminals 11 are mounted on side 10*a*, and electrical components (not shown) are mounted on side 10*b*. The components located on side 10*b* may be printed circuit cards or other types of circuit modules. Terminals 11 extend through panel 10, and they are selectively connected to the various components on side 10*b* of the panel. The various components located on side 10*b* can be interconnected by placing wires between selected ones of terminals 11 on side 10*a***.

Figure 4:
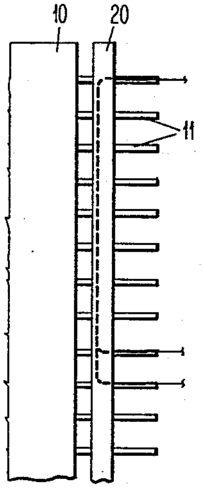
FIGURE 4 shows the mat shown in FIGURE 2 inserted over the terminals on a back-panel shown in FIGURE 3.
Figure 5:
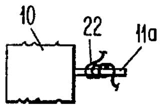
FIGURE 5 shows a wire connected to a terminal by wire wrapping techniques.

In order to make the connections designated as A, B and C above, mat 20 is placed over terminals 11 as shown in FIGURE 4. The end pieces of each wire are thereby juxtaposed to the specific terminals which must be connected to the particular end pieces. Each wire end can now be attached to its appropriate terminal by "wire wrapping" or other conventional techniques. Terminal **11*a* with wire 22** attached thereto by conventional wire wrapping technique is shown in FIGURE 5.

The silicone rubber need not be applied to the entire surface of template 3 as shown herein. If there are a group of wires in one area of the template, merely this area need be covered with the silicone rubber. In this event, the mat can have an irregular shape. For ease in inserting the mat over the correct terminals 11, the silicone should cover enough of template 3 so that the mat can be easily indexed over the correct terminal on back-panel 10. For example, if the silicone merely extended to two corners of the template 3 the mat can easily be indexed over the correct terminals 11 on back-panel 10.

In some instances wires are connected from terminals on the back-panel to other terminals which are not located on the back-panel. In this instance, the end of the wires which do connect to a terminal on the back-panel can be embedded in the mat as described above. The other end is allowed to remain loose and it can be labeled to indicate the particular terminal which is to be connected.

In the specific embodiment shown herein the terminals are interconnected by wires. Naturally, the wires which are shown herein could be replaced with other types of electrical components and the wires shown are merely illustrative of one particular type of electrical component. Furthermore, each of the electrical components used to interconnect the terminals could have two or more output wires which interconnect the terminals on the back-panel. The term back-panel as used herein merely refers to a supporting member for an array of terminals.

While the invention has been particularly shown and described with reference to a preferred embodiment thereof, it will be understood by those skilled in the art that the foregoing and other changes in the form and details may be made therein without departing from the spirit and scope of the invention.

What is claimed is:

1. The method of interconnecting terminals on a back-panel by a plurality of wires, comprising the steps of:
   - forming a mat which has a plurality of holes corresponding to a plurality of terminals on said back-panel, the ends of each wire extending through the holes in said mat which correspond to the terminals to be interconnected by said wire;
   - positioning said mat over the terminals on said back-panel;
   - interconnecting each wire to the terminal juxtaposed thereto; and
   - removing said mat from said wires.

2. The method of interconnecting terminals on a back-panel by a plurality of wires, comprising the steps of:
   - forming a mat which has a plurality of holes corresponding to a plurality of terminals on said back-panel, the ends of each wire extending through the holes in said mat which correspond to the terminals to be interconnected by said wire;
   - positioning said mat over the terminals on said back-panel; and
   - interconnecting each wire to the terminal juxtaposed thereto.

3. The method of interconnecting terminals on a back-panel by a plurality of wires comprising the steps of:
   - positioning said wires on a template which has one pin corresponding to each terminal on said back-panel, each wire being positioned with its ends next to the pins which said wire will interconnect;
   - applying liquid silicone rubber to said wires and said template;
   - curing said silicone rubber thereby forming a mat having said wires embedded therein, said mat having one hole corresponding to each pin on said template;
   - removing said mat from said template;
   - positioning said mat on said back-panel the holes formed by said pins being used for alignment, the ends of each wire thereby being juxtaposed to the appropriate terminals; and
   - attaching the ends of each wire to the appropriate terminals.

4. The method of interconnecting terminals on a back-panel by a plurality of components, comprising the steps of:
   - forming a mat which has a plurality of holes corresponding to a plurality of terminals on said back-panel, the ends of each component extending through the holes in said mat which correspond to the terminals to be interconnected by said component;
   - positioning said mat over the terminals on said back-panel; and
   - interconnecting each component to the terminals juxtaposed thereto.

5. The method of interconnecting terminals on a back-panel by a plurality of components, comprising the steps of:
   - forming a mat which has a plurality of holes corresponding to a plurality of terminals on said backpanel, the ends of each component extending through the holes in said mat which corresponds to the terminals to be interconnected by said component;

positioning said mat over the terminals on said backpanel;

interconnecting each component to the terminals juxtaposed thereto; and removing said mat from said components.

6. The method of interconnecting terminals on a backpanel by a plurality of wires, comprising the steps of:

forming a mat which has a plurality of holes corresponding to a plurality of terminals on said backpanel, and the ends of each wire juxtaposed to the holes in said mat which correspond to the terminals to be interconnected by said wire;

positioning said mat over the terminals on said backpanel;

interconnecting each wire to the terminal juxtaposed thereto; and removing said mat from said wires.

References Cited by the Examiner

UNITED STATES PATENTS

| | | | |
|---|---|---|---|
| 1,755,934 | 4/1929 | Reyner et al. | 29—155.5 |
| 2,066,876 | 1/1937 | Carpenter et al | 29—155.5 |
| 2,083,865 | 6/1937 | Rensink | 29—424 |
| 2,810,738 | 10/1957 | Slack | 29—424 |
| 2,959,848 | 11/1960 | Savitt | 29—203 |
| 3,019,489 | 2/1962 | Burg | 29—155.5 |
| 3,079,672 | 3/1963 | Bain et al. | 317—101 |
| 3,089,199 | 5/1963 | Halacsy | 264—272 |
| 3,103,061 | 9/1963 | Fonoroff | 29—155.55 |

CHARLIE T. MOON, *Primary Examiner.*

JOHN M. ROMANCHIK, *Assistant Examiner.*